US008729533B2

(12) United States Patent
Kim et al.

(10) Patent No.: US 8,729,533 B2
(45) Date of Patent: May 20, 2014

(54) ORGANIC ELECTROLUMINESCENT DISPLAY DEVICE

(75) Inventors: Sang-Dae Kim, Daegu (KR);
Sung-Hoon Choi, Daegu (KR);
Seok-Jong Lee, Gumi-si (KR); Kyu-Il Han, Gumi-si (KR); Byung-soo Kim, Seoul (KR); Eun-Jung Park, Daegu (KR); Young-Dock Cho, Busan (KR); Hong-Je Yun, Gumi-si (KR); Tae-Il Kum, Daegu (KR); Gwi-Jeong Cho, Daegu (KR)

(73) Assignee: LG Display Co., Ltd., Seoul (KR)

( * ) Notice: Subject to any disclaimer, the term of this patent is extended or adjusted under 35 U.S.C. 154(b) by 174 days.

(21) Appl. No.: 13/337,971

(22) Filed: Dec. 27, 2011

(65) Prior Publication Data
US 2012/0248418 A1 Oct. 4, 2012

(30) Foreign Application Priority Data
Apr. 1, 2011 (KR) .................. 10-2011-0030364

(51) Int. Cl.
*H01L 29/08* (2006.01)

(52) U.S. Cl.
USPC ........... 257/40; 257/59; 257/72; 257/E51.018

(58) Field of Classification Search
USPC ................................ 257/40, 72, 59
See application file for complete search history.

(56) References Cited

U.S. PATENT DOCUMENTS

2003/0209707 A1* 11/2003 Tsuchiya ..................... 257/40
2006/0169979 A1* 8/2006 Endo ............................ 257/59

OTHER PUBLICATIONS

Kido et al, "Bright Organic Electroluminescent Devices with Double-Layer Cathode," IEEE Trans. Electron Devices, 40 (1993), 1342-1344.*

* cited by examiner

*Primary Examiner* — A. Sefer
(74) *Attorney, Agent, or Firm* — Brinks Gilson & Lione (57) ABSTRACT

An organic electroluminescent display device includes a first substrate including a display region including a plurality of pixel regions; a first electrode in each pixel region; an organic light emitting layer on the first electrode; a second electrode on the organic light emitting layer and in the display region, wherein the second electrode includes a first metal material having a first wt %, a first work function, and a first sheet resistance, and a second metal material having a second wt % less than the first wt %, a second work function less than the first work function, and a second sheet resistance greater than the first sheet resistance.

16 Claims, 6 Drawing Sheets

ORGANIC ELECTROLUMINESCENT DISPLAY DEVICE

This application claims the priority and the benefit under 35 U.S.C. §119(a) on Patent Application No. 10-2011-0030364 filed in Republic of Korea on Apr. 1, 2011, the entire contents of which are hereby incorporated by reference.

BACKGROUND

1. Field of the Invention

The present disclosure relates to an organic electroluminescent display device.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and organic electroluminescent display (OELD) devices, as a substitute for CRTs. Of these flat panel displays, OELD devices have many advantages, such as low power driving, thin profile, wide viewing angle, light weight, and fast response time.

The OELD device is widely used for various electronic devices such as TV, monitor, mobile phone.

The OELD device includes an array element and a light emitting diode. The array element includes a switching thin film transistor connected to gate and data lines, a driving thin film transistor connected to the organic light emitting diode, and the light emitting diode includes a first electrode connected to the driving thin film transistor, a organic light emitting layer, and a second electrode.

Light generated from the organic light emitting diode is emitted through the first or second electrode to display images. In consideration of aperture ratio, a top emission type OELD is suggested that displays images using a light passing through the second electrode.

However, the second electrode on the organic light emitting layer can't be formed using a sputtering method, which is a conventional method to deposit a metal material, in order to prevent damage to the organic light emitting layer. Accordingly, the second electrode is generally formed using a vacuum thermal deposition method.

The first electrode is made of a transparent conductive material such as indium-tin-oxide (ITO) having a high work function to be acted as an anode, and the second electrode is made of a metal material having a low work function to be acted as a cathode.

However, since the metal material for the second electrode is opaque, when this metal material is deposited to the same thickness as a conventional electrode i.e., 1000 Å to 4000 Å, light can't pass through it.

Accordingly, to achieve a transparency of the second electrode, it is formed to have a thickness of 10 Å to 200 Å. In this case, a light transmittance of the second electrode reaches 15% or more that is substantially a brightness level of a normal display device.

However, when the second electrode is formed to have the above thickness, a sheet resistance thereof becomes 20 ohm/sq (Ω/⬜) to 1000 ohm/sq (Ω/⬜). In this case, since a resistance of the second electrode increases, a driving voltage increases and power consumption thus increases. Accordingly, when the OELD device is employed in a portable electronic device, a battery discharge is caused in short time.

BRIEF SUMMARY

An organic electroluminescent display device includes a first substrate including a display region including a plurality of pixel regions; a first electrode in each pixel region; an organic light emitting layer on the first electrode; a second electrode on the organic light emitting layer and in the display region, wherein the second electrode includes a first metal material having a first wt %, a first work function, and a first sheet resistance, and a second metal material having a second wt % less than the first wt %, a second work function less than the first work function, and a second sheet resistance greater than the first sheet resistance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Reference will now be made in detail to illustrated embodiments of the present invention, which are illustrated in the accompanying drawings.

Figure 1:
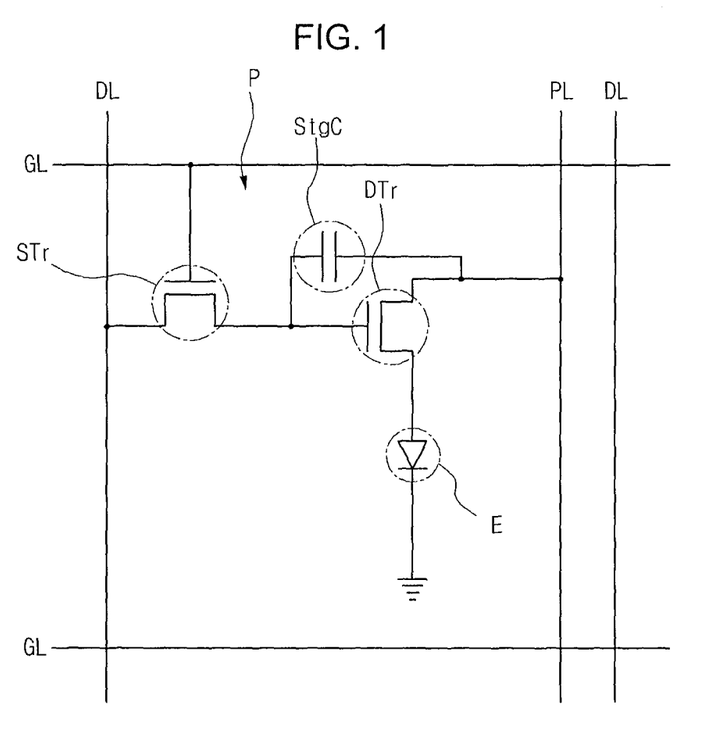
FIG. 1 is a circuit diagram illustrating an OELD device according to an embodiment of the present invention.

FIG. 1 is a circuit diagram illustrating an OELD device according to an embodiment of the present invention.

Referring to FIG. 1, a pixel region of the OELD device 100 of the embodiment includes a switching thin film transistor STr, a driving thin film transistor DTr, a storage capacitor StgC, and an organic light emitting diode E.

A gate line GL extends along a first direction, and a data line DL extends along a second direction crossing the first direction. The gate and data lines GL and DL defines the pixel region. A power line PL supplying a power voltage extends spaced apart from the data line DL.

A switching thin film transistor STr is connected to the gate and data lines GL and DL, and the driving thin film DTr is connected to the switching thin film transistor STr.

A first electrode of the organic light emitting diode E is connected to a drain electrode of the driving thin film transistor DTr, a second electrode of the organic light emitting diode E is connected to a ground terminal. The power voltage supplied to the power line PL is applied to the organic light emitting diode E through the driving thin film transistor DTr. The storage capacitor StgC is connected between gate and source electrodes of the driving thin film transistor DTr.

When a gate signal is supplied to the gate line GL, the switching thin film transistor STr is turned on, and a data signal supplied to the data line DL is applied to the gate electrode of the driving thin film transistor DTr through the switching thin film transistor STr. Accordingly, the driving thin film transistor DTr is turned on, and the organic light emitting diode emits light. A level of the current flowing the organic light emitting diode E is determined according to a level of the data signal applied to the gate electrode of the driving thin film transistor DTr, a brightness of the light emitted from the organic light emitting diode E is determined according to the level of the current. The storage capacitor StgC stores a voltage of the gate electrode of the driving thin film transistor DTr when the switching thin film transistor STr is turned off.

Figure 2A:
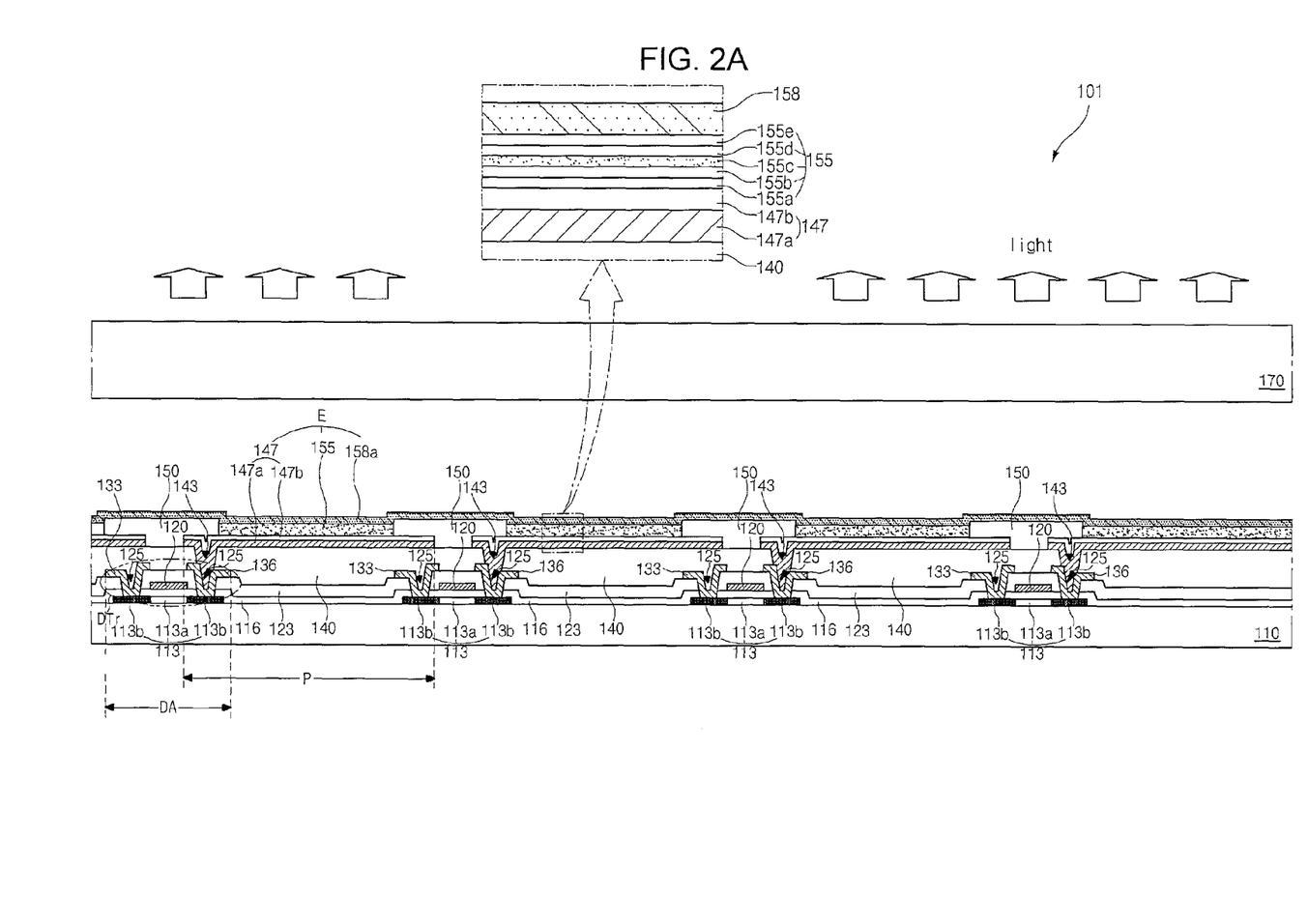
FIGS. 2A and 2B are cross-sectional views illustrating display regions of OELD devices according to the embodiment of the present invention.
Figure 2B:
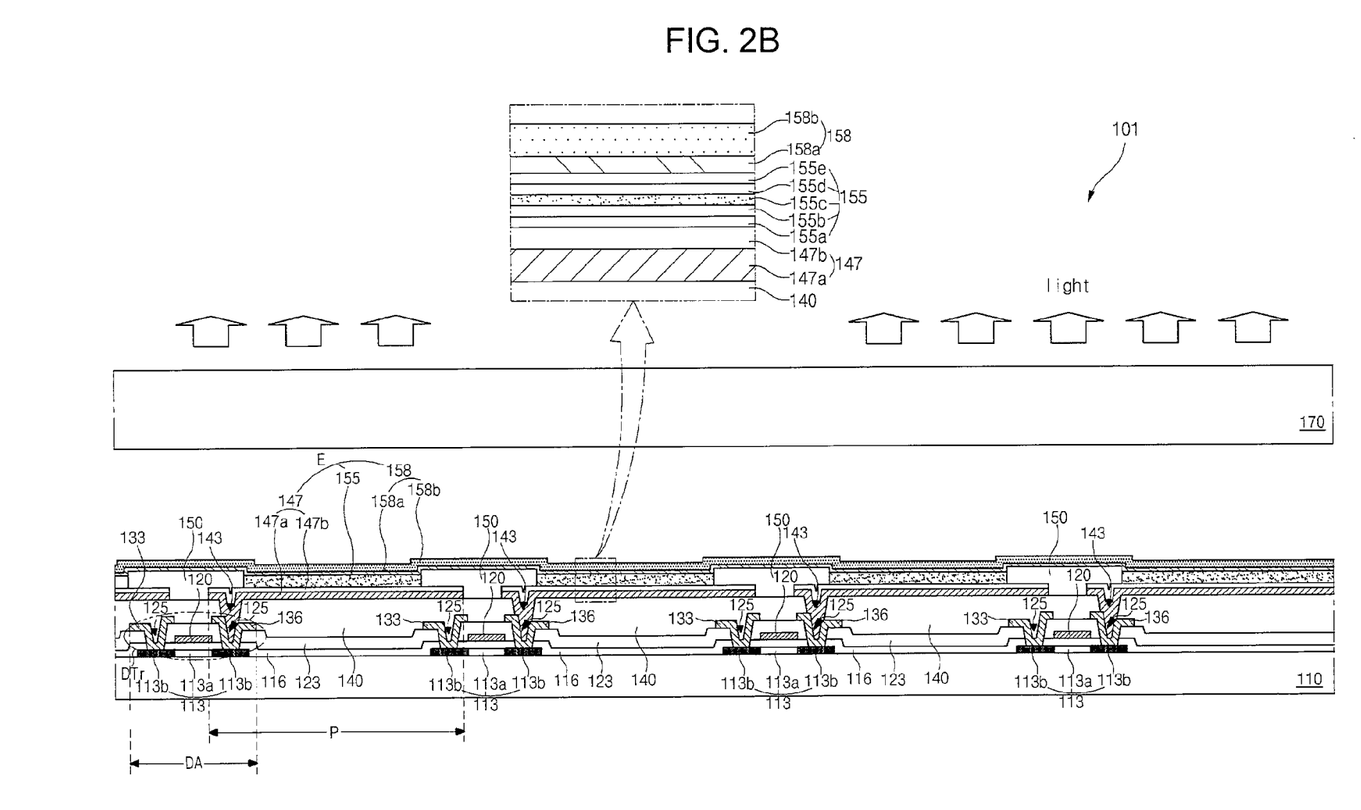

FIGS. 2A and 2B are cross-sectional views illustrating display regions of OELD devices according to the embodiment of the present invention. For the purpose of explanations, a region where a driving thin film transistor DTr is formed is referred to as a driving region DA, and a region where a switching thin film transistor (not shown) is formed is referred to as a switching region. Further, the same components between the OELD devices 101 of FIGS. 2A and 2B have the same reference numerals and are explained commonly.

Referring to FIGS. 2A and 2B, the OELD device 101 includes an array substrate that includes the switching thin film transistor, the driving thin film transistor DTr, and an organic light emitting diode E on a substrate 110, and an opposing substrate 170. The opposing substrate 170 may be substituted with an inorganic or organic film.

A semiconductor layer 113 is formed in the driving region DA on the substrate 110. The semiconductor layer 113 includes a first region 113a that is made of intrinsic polysilicon at a center portion and acts as a channel, and a second region 113b that is made of impurity-doped polysilicon at each of both sides. Although not shown in the drawings, another semiconductor layer having the same configuration as the semiconductor layer 113 is formed in the switching region.

A buffer layer may be formed between the substrate 110 and the semiconductor layer 113. The buffer layer may be made of an inorganic insulating material, for example, silicon oxide (SiO2) or silicon nitride (SiNx). The buffer layer acts to prevent property of the semiconductor layer 113 from being degraded due to alkali ions emitted from the substrate 110 in crystallizing the semiconductor layer 113.

A gate insulating layer 116 is formed on the semiconductor layer 113. A gate electrode 120 is formed on the gate insulating layer 116 corresponding to the first region 113a. Further, a gate line (not shown) is formed on the gate insulating layer 116 and connected to a gate electrode (not shown) formed in the switching region.

An inter-layered insulating film 123 is formed on the gate electrode 120 and the gate line and is made of an inorganic insulating material such as silicon oxide (SiO2) or silicon nitride (SiNx). A semiconductor contact hole 125 is formed in the inter-layered insulating film 123 and the gate insulating layer 116 to expose the corresponding second region 113b.

A data line and a power line spaced apart from the data line are formed on the inter-layered insulating film 123. The data line crosses the gate line to form a pixel region P. Further, source and drain electrodes 133 and 136 are formed in each of the driving region DA and the switching region on the inter-layered insulating film 123. The source and drain electrodes 133 and 136 contacts the second regions 113b through the semiconductor contact holes 125, respectively.

The semiconductor layer 113, the gate insulating layer 116, the gate electrode 120, the inter-layered insulating film 123 and the source and drain electrodes 133 and 136 in the driving region DA form the driving thin film transistor DTr. Further, the switching thin film transistor in the switching region has the same structure as the driving thin film transistor DTr.

The switching thin film transistor is connected to the gate and data lines, and further, is connected to the gate electrode 120 of the driving thin film transistor DTr.

The driving thin film transistor DTr and the switching thin film transistor may be p type or n type according to the type of impurity which the semiconductor layer 113 is doped with. When the p type thin film transistor is used, the second region 113b is doped with a group III element, such as boron (B), as a dopant. When n type thin film transistor is used, the second region 113b is doped with a group V element, such as phosphorus (P), as a dopant.

The p type thin film transistor uses a hole as a carrier while the n type thin film transistor uses an electron as a carrier. Accordingly, a first electrode 147 connected to the drain electrode 136 of the driving thin film transistor DTr acts as a anode or cathode according to the type of the driving thin film transistor DTr.

In other words, when the driving thin film transistor DTr is the p type, the first electrode 147 acts as an anode, and when the driving thin film transistor DTr is the n type, the first electrode 147 acts as a cathode.

For the purpose of explanations, in the embodiment, the driving thin film transistor DTr is the p type, and the first electrode 147 thus acts as the anode.

A passivation layer 140 is formed on the driving thin film transistor DTr and the switching thin film transistor and includes a drain contact hole exposing the drain electrode 143.

The first electrode 147 is formed on the passivation layer 140 and connected to the drain electrode 136 of the driving thin film transistor DTr through the drain contact hole 143. The first electrode 147 may be made of a conductive material having a relatively high work function of about 4.8 eV to about 5.2 eV, such as indium-tin-oxide (ITO) or silver (Ag) and have a single or multiple-layered structure.

When a transparent conductive material such as ITO is used for the first electrode 147, the first electrode 147 may have a double-layered structure that includes a first layer 147a made of a high reflection metal material, such as aluminum (Al) or aluminum alloy (e.g., AlNd) to increase a light emission efficiency of an organic light emitting diode E, and a second layer 147b made of the transparent conductive material having a relatively high work function of about 4.8 eV to about 5.2 eV. In this embodiment, it is shown as an example that the first electrode 147 includes the first layer 147a of aluminum (Al) or aluminum alloy (e.g., AlNd) and the second layer 147b of ITO.

A bank 150 is formed at a boundary of the pixel region P on the passivation layer 140. The bank 150 overlaps sides of the first electrode 147.

An organic light emitting layer 155 is formed on the first electrode 147. The organic light emitting layer 155 may be surrounded by the bank 150. The organic light emitting layer 155 may have a single or multiple-layered structure. When the organic light emitting layer 155 has a multiple-layered structure to increase a light emission efficiency, it may have a 5-layered structure that include a hole injecting layer 155a, a hole transporting layer 155b, an organic light emitting material layer 155c, an electron transporting layer 155d and an electron injecting layer 155e sequentially formed on the first electrode 147. Alternatively, the organic light emitting layer 155 may have a 4-layered structure that includes a hole transporting layer 155b, an organic light emitting material layer 155c, an electron transporting layer 155d and an electron injecting layer 155e sequentially formed on the first electrode 147. Alternatively, the organic light emitting layer 155 may have a 3-layered structure that includes a hole transporting layer 155b, an organic light emitting material layer 155c, and an electron transporting layer 155d sequentially formed on the first electrode 147. In the embodiment, it is shown as an example that the organic light emitting layer 155 has a 5-layered structure.

The hole injecting layer 155a acts to smoothly inject a hole from the first electrode 147 to the organic light emitting material layer 155c, and may be made of at least one selected from a group consisting of CuPc (copper phthalocyanine), PEDOT (poly(3,4)-ethylenedioxythiophene), PANI (polyaniline) and NPD (N,N-dinaphthyl-N,N'-diphenyl benzidine).

The hole transporting layer 155b acts to smoothly transport a hole, and may be made of at least one selected from a group consisting of NPD (N,N-dinaphthyl-N,N'-diphenyl benzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine).

The electron transporting layer 155d acts to smoothly transport an electron, and may be made of at least one selected from a group consisting of Alq3 (tris(8-hydroxyquinolino) aluminum), PBD, TAZ, spiro-PBD, BAlq and SAlq.

The electron injecting layer 155e acts to smoothly inject an electron, and may be made of at least one selected from a group consisting of Alq3 (tris(8-hydroxyquinolino)aluminum), PBD, TAZ, spiro-PBD, BAlq and SAlq. The electron injecting layer 155e may further include an organic material, and this organic material may include a metal compound. The metal compound may include an alkali metal or alkali earth metal. In this case, the metal compound may be at least one of LiQ, LiF, NaF, KF, RbF, CsF, FrF, BeF2, MgF2, CaF2, SrF2, BaF2, and RaF2.

A second electrode 158 is formed on the organic light emitting layer 155 and the bank 150 and acts as a cathode. The second electrode 158 may be made of at least two different types of metal materials. The first electrode 147, the second electrode 158, and the organic light emitting layer 155 therebetween form the organic light emitting diode E.

The second electrode 158 may be formed with a single-layered structure using a co-deposition method for a first metal material and a second metal material, as shown in FIG. 2A. Alternatively, the second electrode 158 may be formed with a double-layered structure that includes a first layer 158a made of the second metal material, and a second layer 158b made of the first metal material on the first layer 158a, as shown in FIG. 2B.

The first metal material has a sheet resistance less than that of the second metal material, and has a work function greater than that of the second metal material. The sheet resistance of the first metal material is preferably about 1 ohm/sq to about 15 ohm/sq, and the sheet resistance of the second metal material is about 100 ohm/sq or more, and more preferably, about 100 ohm/sq to about 10000 ohm/sq. To meet these properties, the first metal material may be silver (Ag), and the second metal material may be magnesium (Mg) or ytterbium (Yb).

The single-layered second electrode 158 of FIG. 2A have the first and second metal materials of different wt %, for example, the first metal material by weight of about 70% to about 98%, and the second metal material by weight of about 2% to about 30%. A total wt % of the first and second metal materials is 100%.

Further, the first metal material has a work function of about 4 eV to about 5 eV, and the second metal material has a work function of about 2 eV to about 4 eV. Since the first and second metal materials are different in wt %, an average work function becomes less than the work function of the first electrode 147. For example, the average work function is about 4.2 eV to about 4.9 eV.

When the second electrode 158 has the double-layered structure as shown in FIG. 2B, the double layers 158a and 158b are formed different in thickness so that an average work function becomes less than the work function of the first electrode 147. For example, the average work function is about 4.2 eV to about 4.9 eV.

In this case, the first layer 158a of the second metal material has a first thickness, and the second layer 158b of the first metal material has a second thickness greater than the first thickness. The second thickness is preferably about 130 Å to about 200 Å, and the first thickness is preferably about 10 Å to about 50 Å.

The single-layered and double-layered second electrodes 158 each have a relatively low sheet resistance of about 5 ohm/sq to about 20 ohm/sq, and a work function of about 4.2 eV to about 4.9 eV less than that of the first electrode 147. Further, the second electrodes 158 each have a light transmittance of about 40% or more with respect to a light having a wavelength of about 460 nm, and a light transmittance of about 35% or more with respect to a light having a wavelength of about 530 nm, and a light transmittance of about 25% or more with respect to a light having a wavelength of about 620 nm.

Since the second electrode 158 has the above properties, it has an excellent film quality, a low sheet resistance, an excellent electron injection, and an excellent light transmission. Accordingly, light emission efficiency is excellent.

Figure 3A:
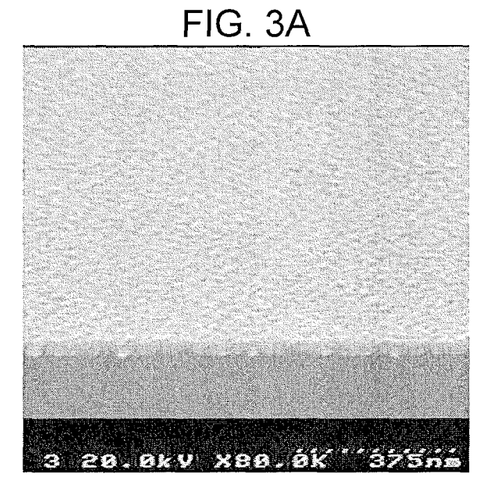
FIGS. 3A and 3B are SEM pictures of second electrodes of first and second comparative examples, respectively.
Figure 3B:
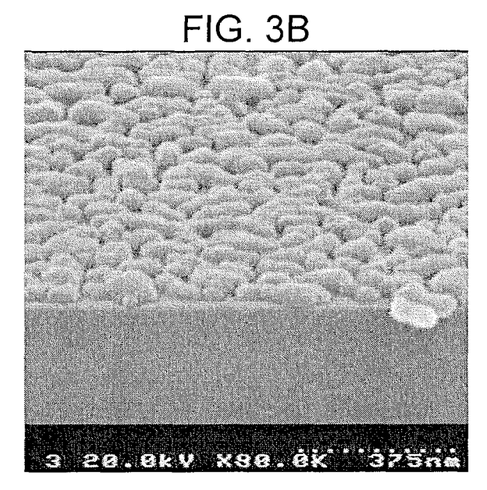
Figure 4A:
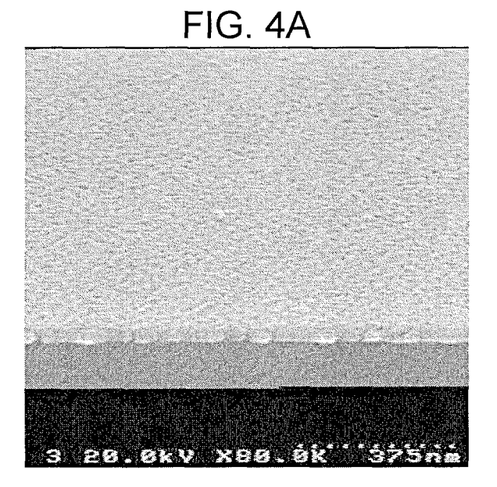
FIGS. 4A to 4C are SEM pictures of second electrodes of first to third embodiment examples, respectively.
Figure 4B:
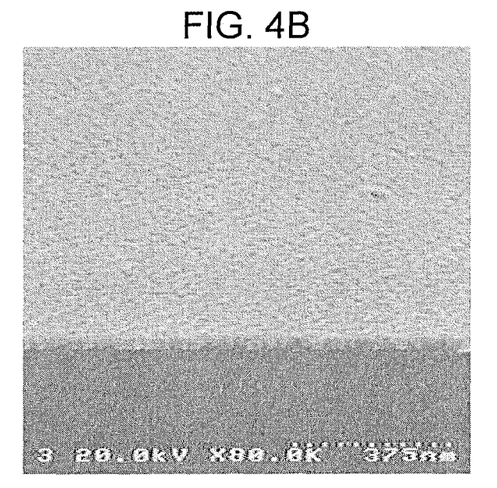
Figure 4C:
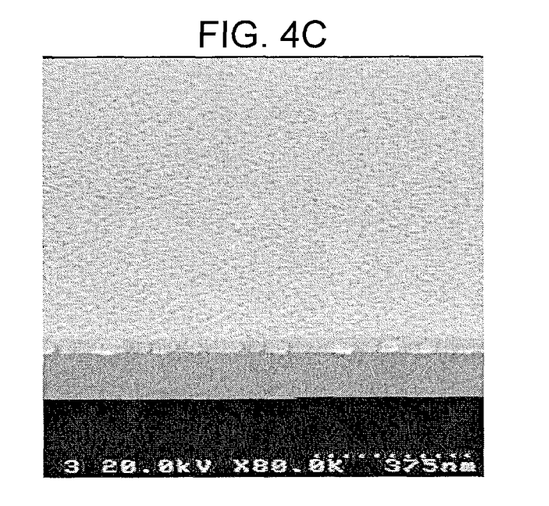

Table 1 shows light transmittances, work functions and sheet resistances of second electrodes according to 5 experimental examples. For the purpose of explanations, 5 experimental examples are first and second comparative examples, and first to third embodiment examples. FIGS. 3A and 3B are SEM pictures of the second electrodes of the first and second comparative examples, respectively, and FIGS. 4A to 4C are SEM pictures of the second electrodes of the first to third embodiment examples, respectively.

TABLE 1

| | Comparative 1 | Comparative 2 | Embodiment 1 | Embodiment 2 | Embodiment 3 |
|---|---|---|---|---|---|
| electrode materials | Mg:Ag | Yb:Ag | Ag:Mg | Ag:Mg | Ag:Mg |
| wt % ratio | 9:1 | — | 5:1 | 7:1 | 9:1 |
| thickness (nm) | 16 | 2/14 | 16 | 16 | 16 |
| transmittance 460 nm (blue) | 38.7 | 40.2 | 47.3 | 46.5 | 46.0 |
| 530 nm (green) | 31.7 | 32.1 | 39.3 | 36.9 | 36.2 |
| 620 nm (red) | 25.2 | 26.9 | 30.0 | 28.0 | 27.3 |
| work function (eV) | 4.0 | 4.7 | 4.6 | 4.6 | 4.6 |
| sheet resistance (ohm/sq) | 35 | 6 | 10.0 | 7.8 | 6.7 |

In the first comparative example, magnesium (Mg) and silver (Ag) are co-deposited at deposition rates of about 0.9 Å/s and about 0.1 Å/s, respectively, and thus a single-layered second electrode having a thickness of about 16 nm is formed. In the second comparative example, ytterbium (Yb) is deposited at a deposition rate of about 0.5 Å/s to have a thickness of about 2 nm, and then silver (Ag) is deposited at a deposition rate of about 0.5 Å/s to have a thickness of about 14 nm, and thus a double-layered second electrode having a thickness of about 16 nm is formed. In the first embodiment example, silver (Ag) and magnesium (Mg) are co-deposited at deposition rates of about 1 Å/s and about 0.2 Å/s, respectively, and thus a single-layered second electrode having a thickness of about 16 nm is formed. In the second embodiment example, silver (Ag) and magnesium (Mg) are co-deposited at deposition rates of about 0.7 Å/s and about 0.1 Å/s, respectively, and thus a single-layered second electrode having a thickness of about 16 nm is formed. In the third embodiment example, silver (Ag) and magnesium (Mg) are co-deposited at deposition rates of about 0.9 Å/s and about 0.1 Å/s, respectively, and thus a single-layered second electrode having a thickness of about 16 nm is formed.

In the aspect of light transmittance, the first embodiment example is the best among the five examples, and overall, the first to third embodiment examples are better than the first and second comparative examples. For instance, the first comparative example has light transmittances of about 38.7%, about 31.7% and about 25.2% at wavelengths of about 460 nm, about 530 nm and about 620 nm, respectively, while the first embodiment example has light transmittances of about 47.3%, about 39.3% and about 30.0% at wavelengths of about 460 nm, 530 nm and 620 nm, respectively.

Further, in the aspect of sheet resistance, the first comparative example has 35 ohm/sq while the first to third embodiment examples have 10.0 ohm/sq, 7.8 ohm/sq and 6.7 ohm/sq, respectively. Accordingly, the first to third embodiment examples are better than the first comparative example. The second comparative example having the double-layered structure is better than the first to third embodiment example. However, looking into the SEM picture of FIG. 3B, the silver (Ag) layer on the ytterbium (Yb) layer has a very much worse quality than the other examples. Accordingly, an OELD device including the second electrode according to the second comparative example has a problem of spot defects due to roughness of the silver layer.

The magnesium (Mg) has a work function of about 3.7 eV, and the silver (Ag) has a work function of about 4.8 eV. Accordingly, in the first comparative example, in which the magnesium (Mg) is contained with a relatively greater wt % to improve a role of the second electrode as an anode, the second electrode is reduced in light transmittance and increases in light absorptance, and thus light emission efficiency is very poor. Further, in the first comparative example, a sheet resistance is relatively greater, and this causes limitation on area size of an OELD device and brightness unevenness according to positions, and thus display quality is degraded.

To solve the problems, as in the second embodiment, ytterbium (Yb) having a work function of about 2.6 eV much less than that of magnesium (Mg) is deposited on an organic light emitting layer to form a first layer, then silver (Ag) is deposited on the first layer to form a second layer, and thus a double-layered second electrode is formed. However, in this case, reduction of light transmittance and poor film quality are caused.

In other words, as shown in FIG. 3B, the second layer of silver (Ag) on the first layer of ytterbium (Yb) has cracks. Accordingly, a light transmittance of the second electrode of the second comparative example is uneven, and thus spot defects occur.

Therefore, in consideration of various aspects of transmittance, sheet resistance, work function, and surface condition, second electrodes of the first to third embodiment examples are better than those of the first and second comparative examples.

Table 2 shows light emission efficiencies and color coordinates according to 5 experimental examples. For the purpose of explanations, 5 experimental examples are a third comparative example, and fourth to seventh embodiment examples.

TABLE 2

| | wt % ratio | | light emission | color coordinate | |
|---|---|---|---|---|---|
| | Ag | Mg | efficiency (cd/A) | CIEx | CIEy |
| Embodiment 4 | 9 | 1 | 4.5 | 0.137 | 0.057 |
| Embodiment 5 | 7 | 1 | 4.3 | 0.136 | 0.056 |
| Embodiment 6 | 5 | 1 | 4.3 | 0.138 | 0.058 |
| Embodiment 7 | 3 | 1 | 4.2 | 0.137 | 0.057 |
| Comparative 3 | 2 | 1 | 3.9 | 0.138 | 0.058 |

The 5 examples are substantially identical except for a wt % ratio between first and second metal materials of a second electrode. In other words, in each of the 5 examples, a first electrode is formed with an area of about 2 mm*2 mm and a thickness of about 100 nm by depositing silver (Ag) on a substrate, then LGC101 (by LG Chemical Co.) is vacuum-deposited with a thickness of about 2 nm on the first electrode, then EL301 (by Hodogaya Chemical Co.) is deposited with a thickness of about 60 nm to form a hole transporting layer, then BH513 (by Idemitsu Chemical Co.) doped with BD313 (Idemitsu Chemical Co.) of 5 wt % is deposited with a thickness of about 30 nm on the hole transporting layer to form a blue organic light emitting material layer. Then, LGC201 (by LG Chemical Co.) and Liq are co-deposited with a thickness of about 30 nm to form an electron transporting layer, and then magnesium (Mg) and silver (Ag) are co-deposited to form a second electrode. In forming the second electrode, wt % ratios between silver (Ag) and magnesium (Mg) are varied according to the 5 examples, as shown in Table 2. Then, an inorganic material, for example, EL301 (by Dogaya Chemical Co.) is deposited with a thickness of about 70 nm.

It is shown that variation of OELD properties such as light emission efficiency and color coordinate among the fourth to seventh embodiment examples is not great.

However, when wt % of silver (Ag) is below about 70%, the color property is hardly influenced, but light emission efficiency is greatly reduced. In other words, when wt % of silver (Ag) is about 75% or more as in the fourth to seventh embodiment examples, light emission efficiency is about 4.2 cd/A to about 4.5 cd/A. Whereas, when wt % of silver (Ag) is about 66.6% as in the third comparative example, light emission efficiency is about 3.9 cd/A, which is much less than those of the fourth to seventh embodiment examples. Accordingly, when wt % of silver (Ag) is below about 70%, light emission efficiency is greatly reduced.

As a result, comparing the embodiment examples with the comparative example, the color properties therebetween are not much different. However, the embodiment examples having silver (Ag) as a first metal material of 70% or more, which is the twice or more of wt % of magnesium (Mg) or ytterbium (Yb) as a second metal material, are much better in light emission efficiency than that of the comparative example having silver (Ag) of below 70%.

Referring back to FIGS. 2A and 2B, the opposing substrate 170 for encapsulation faces and is spaced apart from the array substrate. An adhesive member formed of a sealant or frit may be formed along peripheral portions on inner surfaces of the array substrate and the opposing substrate 170 to couple them.

A space between the array substrate and the opposing substrate 170 is under a vacuum condition or under an inert gas condition by being filled with an inert gas.

The opposing substrate 170 may be formed of plastic or glass. This embodiment shows the opposing substrate 170 spaced apart from the array substrate as an example. Alternatively, an opposing substrate may be configured as a film type including an adhesive layer and contact the second electrode 158 as a top layer of the array substrate. Alternatively, a capping layer such as an organic or inorganic insulating layer may be formed on the second electrode 158 and act as an encapsulating film instead of the opposing substrate. The capping layer may be made of an inorganic insulating material such as silicon oxide ($SiO_2$) or silicon nitride (SiNx), or an organic insulating material such as polymer or monomer.

As described above, the OELD device of the embodiment includes the second electrode that is made of the first metal material having a first work function and about 70 wt % to 98 wt %, and the second metal material having a second work function greater than the first work function. Accordingly, the second electrode has a low-level sheet resistance of about 5 ohm/sq to about 20 ohm/sq, a work function of about 4.2 eV to about 4.9 eV, and light transmittances of about 40% or more at a wavelength of about 460 nm, about 35% or more at a wavelength of about 530 nm and about 25% or more at a wavelength of about 620 nm.

Accordingly, the second electrode can have an excellent film quality, a low sheet resistance, and a high light transmittance. Therefore, light emission efficiency is excellent.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An organic electroluminescent display device, comprising:
  a first substrate including a display region including a plurality of pixel regions;
  a first electrode in each pixel region;
  an organic light emitting layer on the first electrode;
  a second electrode on the organic light emitting layer and in the display region, wherein the second electrode includes a first metal material having a first work function, and a first sheet resistance, and a second metal material having a second work function less than the first work function, and a second sheet resistance greater than the first sheet resistance, wherein the second electrode has an average light transmittance of about 40% or more at a wavelength of about 460 nm, an average light transmittance of about 35% or more at a wavelength of about 530 nm, and an average light transmittance of about 25% or more at a wavelength of about 620 nm.

2. The device according to claim 1, wherein the first work function is about 4 eV to about 5 eV, and the second work function is about 2 eV to about 4 eV, and wherein an average work function of the second electrode is about 4.2 eV to about 4.9 eV that is less than a work function of the first electrode.

3. The device according to claim 1, wherein the first sheet resistance is about 1 ohm/sq to about 15 ohm/sq, and the second sheet resistance is about 100 ohm/sq or more, and wherein an average sheet resistance of the second electrode is about 5 ohm/sq to about 20 ohm/sq.

4. The device according to claim 1, wherein the first metal material is silver (Ag), and the second metal material is magnesium (Mg) or ytterbium (Yb).

5. The device according to claim 1, wherein the second electrode has a double-layered structure that includes a first layer of the second metal material having a first thickness, and a second layer of the first metal material on the first layer and having a second thickness greater than the first thickness.

6. The device according to claim 5, wherein the first thickness is about 10 Å to about 50 Å, and the second thickness is about 130 Å to about 200 Å.

7. The device according to claim 1, further comprising:
  at least one of a hole injecting layer and a hole transporting layer between the organic light emitting layer and the first electrode; and
  at least one of an electron transporting layer and an electron injecting layer between the organic light emitting layer and the second electrode.

8. The device according to claim 7, wherein the hole injecting layer includes at least one of CuPc (copper phthalocyanine), PEDOT (poly(3,4)-ethylenedioxythiophene), PANI (polyaniline) and NPD (N,N-dinaphthyl-N,N'-diphenyl benzidine), wherein the hole transporting layer includes at least one of NPD (N,N-dinaphthyl-N,N'-diphenyl benzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), wherein the electron transporting layer includes at least one of Alq3 (tris(8-hydroxyquinolino)aluminum), PBD, TAZ, spiro-PBD, BAlq and SAlq, and wherein the electron injecting layer includes at least one of Alq3 (tris(8-hydroxyquinolino)aluminum), PBD, TAZ, spiro-PBD, BAlq and SAlq.

9. The device according to claim 8, wherein the electron injecting layer further includes a metal compound, comprising at least one of LiQ, LiF, NaF, KF, RbF, CsF, FrF, BeF2, MgF2, CaF2, SrF2, BaF2, and RaF2.

10. The device according to claim 1, further comprising:
  a switching thin film transistor and a driving thin film transistor below the first electrode;
  a passivation layer covering the switching thin film transistor and the driving thin film transistor and exposing a drain electrode of the driving thin film transistor; and
  a bank overlapping a peripheral portion of the first electrode and at a boundary between the pixel regions,
  wherein the first electrode is on the passivation layer and contacts the drain electrode of the driving thin film transistor.

11. The device according to claim 10, wherein the first electrode has a single-layered structure made of silver (Ag) or indium-tin-oxide (ITO), or a double layered structure that includes a first layer made of aluminum (Al) and aluminum alloy to reflect light from the organic light emitting layer toward the second electrode, and a second layer made of indium-tin-oxide (ITO) on the first layer.

12. The device according to claim 10, further comprising an opposing substrate facing the first substrate having the second electrode, or a capping layer covering the second electrode.

13. The device according to claim 12, wherein the opposing substrate is made of plastic or glass; and a space between the first substrate and the opposing substrate is under a vacuum condition or under an inert gas condition.

14. The device according to claim 12, wherein a capping layer covers the second electrode, and the capping layer is made of an inorganic insulating material that is silicon oxide (SiO2) or silicon nitride (SiNx), or an organic insulating material that is polymer or monomer.

15. The device according to claim 10, wherein the switching thin film transistor and the driving thin film transistor are p type transistors, and wherein the first electrode is an anode and the second electrode is a cathode.

16. The device according to claim 10, further comprising:
gate and data lines crossing each other to define the pixel region and connected to a gate electrode and a source electrode, respectively, of the switching thin film transistor; and
a power line parallel with the data line.

* * * * *